United States Patent
Chang et al.

(10) Patent No.: US 9,368,502 B2
(45) Date of Patent: Jun. 14, 2016

(54) REPLACEMENT GATE MULTIGATE TRANSISTOR FOR EMBEDDED DRAM

(75) Inventors: Josephine B. Chang, Mahopac, NY (US); Leland Chang, New York, NY (US); Michael A. Guillorn, Yorktown Heights, NY (US); Wilfried E. Haensch, Yorktown Heights, NY (US)

(73) Assignee: GlogalFoundries, Inc., Ugland House (KY)

( * ) Notice: Subject to any disclaimer, the term of this patent is extended or adjusted under 35 U.S.C. 154(b) by 0 days.

(21) Appl. No.: 13/274,758

(22) Filed: Oct. 17, 2011

(65) Prior Publication Data
US 2013/0092992 A1    Apr. 18, 2013

(51) Int. Cl.
| | |
|---|---|
| *H01L 27/108* | (2006.01) |
| *H01L 21/02* | (2006.01) |
| *H01L 21/84* | (2006.01) |
| *H01L 29/78* | (2006.01) |
| *H01L 29/49* | (2006.01) |
| *H01L 29/66* | (2006.01) |

(52) U.S. Cl.
CPC ........ *H01L 27/10823* (2013.01); *H01L 21/845* (2013.01); *H01L 27/10829* (2013.01); *H01L 27/10861* (2013.01); *H01L 27/10876* (2013.01); *H01L 29/49* (2013.01); *H01L 29/66545* (2013.01); *H01L 29/785* (2013.01)

(58) Field of Classification Search
CPC ............ H01L 29/785; H01L 29/66545; H01L 21/845
USPC ....................................................... 438/243
See application file for complete search history.

(56) References Cited

U.S. PATENT DOCUMENTS

| | | | |
|---|---|---|---|
| 4,983,544 A * | 1/1991 | Lu et al. | 438/698 |
| 6,300,211 B1 * | 10/2001 | Togo | 438/386 |
| 6,348,385 B1 * | 2/2002 | Cha et al. | 438/287 |
| 7,153,737 B2 | 12/2006 | Kwon et al. | 438/243 |
| 7,534,675 B2 | 5/2009 | Bangsaruntip et al. | 438/197 |
| 7,737,482 B2 | 6/2010 | Cheng et al. | 257/301 |
| 7,777,282 B2 | 8/2010 | Majhi et al. | 257/401 |
| 7,781,771 B2 * | 8/2010 | Lindert et al. | 257/66 |

(Continued)

FOREIGN PATENT DOCUMENTS

| | | |
|---|---|---|
| CN | 1212454 A | 3/1999 |
| CN | 1512589 A | 7/2004 |
| CN | 101375398 A | 2/2009 |

OTHER PUBLICATIONS

R. Katsumata, N. Tsuda, J. Idebuchi, M. Kondo, N. Aoki, S. Ito, K Yahashi, T. Satonaka, M. Morikado, M. Kito, M. Kido, T. Tanaka, H. Aochi and T. Hamamoto, "Fin-Array-FET on bulk silicon for sub-100 nm Trench Capacitor DRAM", 2003 Symposium on VLSI Technology Digest of Technical Papers, p. 61-62.*

(Continued)

*Primary Examiner* — Ermias Woldegeorgis
*Assistant Examiner* — John Bodnar
(74) *Attorney, Agent, or Firm* — Heslin Rothenberg Farley & Mesiti P.C.; George Blasiak

(57) ABSTRACT

A memory cell, an array of memory cells, and a method for fabricating a memory cell with multigate transistors such as fully depleted finFET or nano-wire transistors in embedded DRAM. The memory cell includes a trench capacitor, a non-planar transistor, and a self-aligned silicide interconnect electrically coupling the trench capacitor to the non-planar transistor.

7 Claims, 20 Drawing Sheets

(56) References Cited

U.S. PATENT DOCUMENTS

| | | | |
|---|---|---|---|
| 7,928,426 B2* | 4/2011 | Chui et al. | 257/24 |
| 8,278,184 B1* | 10/2012 | Chen et al. | 438/433 |
| 8,779,529 B2* | 7/2014 | Sen et al. | 257/410 |
| 8,802,524 B2* | 8/2014 | Liao et al. | 438/212 |
| 2004/0016951 A1 | 1/2004 | Mizushima | |
| 2004/0150037 A1* | 8/2004 | Katsumata | H01L 29/945 257/330 |
| 2006/0071260 A1* | 4/2006 | Yamasaki | 257/301 |
| 2008/0048186 A1 | 2/2008 | Cheng et al. | 257/48 |
| 2008/0079094 A1* | 4/2008 | Jin et al. | 257/401 |
| 2008/0108199 A1 | 5/2008 | Schwerin | |
| 2008/0315309 A1 | 12/2008 | Chang et al. | 257/436 |
| 2009/0008631 A1* | 1/2009 | Hurkx et al. | 257/25 |
| 2009/0108314 A1* | 4/2009 | Cai et al. | 257/301 |
| 2009/0146194 A1 | 6/2009 | Moselund et al. | |
| 2009/0184392 A1 | 7/2009 | Cheng et al. | 257/532 |
| 2010/0102373 A1 | 4/2010 | Li et al. | 257/301 |
| 2010/0148234 A1 | 6/2010 | Torek et al. | 257/296 |
| 2010/0244112 A1* | 9/2010 | Voldman | 257/301 |
| 2011/0171796 A1* | 7/2011 | Tang et al. | 438/253 |
| 2012/0049262 A1* | 3/2012 | Huang et al. | 257/304 |

OTHER PUBLICATIONS

Katsumata et al. "Fin-Array-FET on Bulk Silicon for Sub-100 nm Trench Capacitor DRAM," 2003 Symposium on VLSI Technology Digest of Technical Papers, 2003, pp. 61-62.).*

Katsumata et al. ("Fin-Array-FET on Bulk Silicon for Sub-100 nm Trench Capacitor DRAM," 2003 Symposium on VLSI Technology Digest of Technical Papers, 2003, pp. 61-62. Herein called Kasumata2).*

Katsumata et al. ("Fin-Array-FET on Bulk Silicon for Sub-100 nm Trench Capacitor DRAM," 2003 Symposium on VLSI Technology Digest of Technical Papers, 2003, pp. 61-62. Herein called Kasumata2.*

Y.-S. Kim et al, "Local-damascene-finFET DRAM integration with p/sup +/ doped poly-silicon gate technology for sub-60nm device generations," IEDM Technical Digest, Dec. 2005, pp. 315-318.

C. Lee et al., "Enhanced data retention of damascene-finFET DRAM with local channel implantation and <100> fin surface orientation engineering," IEDM Technical Digest, Dec. 2004, pp. 61-64.

International Search Report and Written Opinion, PCT Application No. PCT/US2012/059154, p. 1-9 (Dec. 10, 2012).

CN 201280050984.3; Office Action dated Dec. 4, 2015; (submitted with copy of original and with full text English translation).

CN 201280050984.3; Search Report Nov. 25, 2015 (submitted with copy of original and full text English translation).

International Application Status Report for PCT/US2012/059154, Apr. 28, 2016.

* cited by examiner

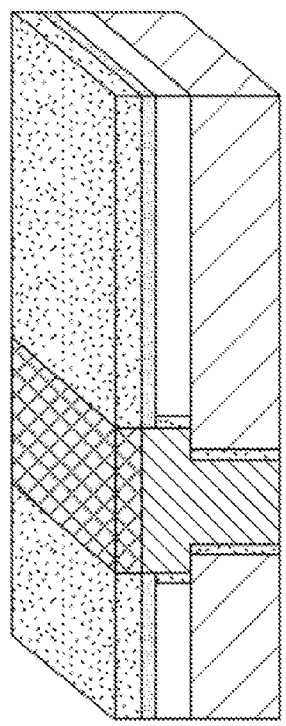
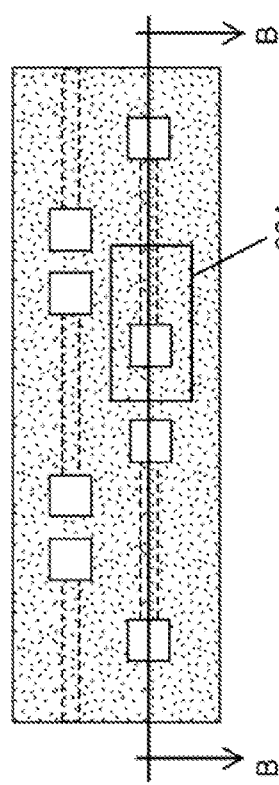
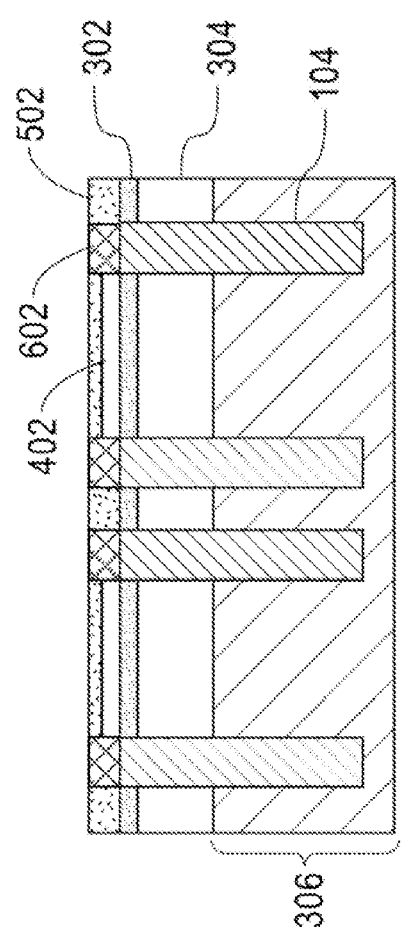
FIG. 6A
FIG. 6B
FIG. 6C

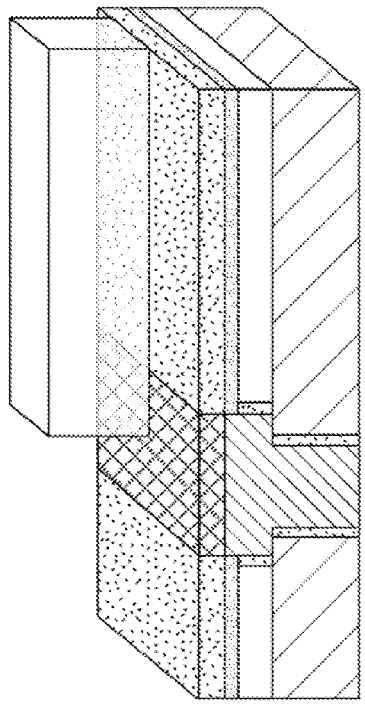
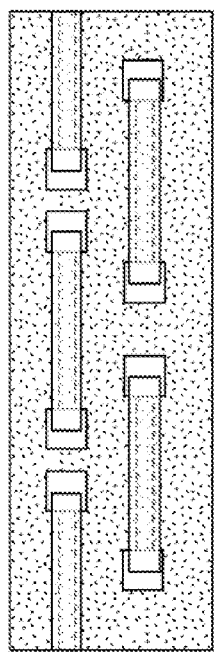
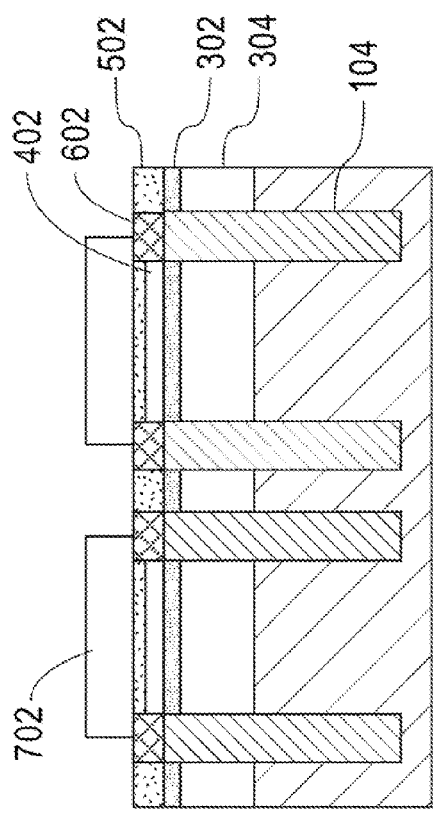
FIG. 7A
FIG. 7B
FIG. 7C

US 9,368,502 B2

REPLACEMENT GATE MULTIGATE TRANSISTOR FOR EMBEDDED DRAM

BACKGROUND

This invention involves the fabrication of computer memory. Specifically, the invention involves the fabrication of embedded DRAM with multigate transistors compatible with conventional planar SOI CMOS devices.

Embedded DRAM ("eDRAM") is a memory technology that allows for device scaling down to 45 nm nodes and beyond. It is roughly three times denser than SRAM. Additionally, fully depleted (undoped channel) multigate devices (FinFET, Trigate and Nanowire) allow for continued CMOS device scaling past the 22 nm node. Such device structures provide improved electrostatic shielding of the transistor channel from adjacent cells. This improved shielding can lower leakage and improve retention time.

BRIEF SUMMARY

An example embodiment of the present invention is a method for forming a memory cell transistor. The method includes forming a trench capacitor within a substrate. The method also includes forming a non-planar transistor within the substrate. The method further includes forming a self-aligned silicide interconnect electrically coupling the trench capacitor to the non-planar transistor.

Another example embodiment of the present invention is a memory cell. The memory cell includes a trench capacitor, a non-planar transistor, and a self-aligned silicide interconnect electrically coupling the trench capacitor to the non-planar transistor.

Yet another example embodiment of the invention is a memory array. The memory array includes a plurality of DRAM memory cells. The DRAM memory cells each include a trench capacitor, a non-planar transistor, and a self-aligned silicide interconnect electrically coupling the trench capacitor to the non-planar transistor. The memory array also includes a processor. The processor and the plurality of DRAM cells are both formed in a monolithic silicon substrate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6A shows the formation of a trench capacitor and STI layer in accordance with an embodiment of the present invention.

FIG. 6B shows a cross-sectional view of FIG. 6A.

FIG. 6C shows an isometric cross-sectional view of FIG. 6A.

FIG. 7A shows the formation of a resist layer above the pad layer and STI layer in accordance with an embodiment of the present invention.

FIG. 7B shows a cross-sectional view of FIG. 7A.

FIG. 7C shows an isometric cross-sectional view of FIG. 7A.

DETAILED DESCRIPTION

The present invention is described with reference to embodiments of the invention. Throughout the description of the invention reference is made to FIGS. 1-20. The figures include numbers accompanied by letters indicating different perspective views of the same object. Unless otherwise noted, the following descriptions apply. Figures labeled with an A show a plan view. Figures labeled with a B show a cross-sectional view (see FIG. 6A, section line B-B). Figures labeled with a C show an isometric cross-sectional view. Figures labeled with a C show an isometric cross-sectional view (see FIG. 6A, cross-section box 604).

As discussed in detail below, embodiments of the present invention include a memory cell, an array of memory cells, and a method for fabricating a memory cell that may use multigate transistors in embedded DRAM.

Figure 1A:
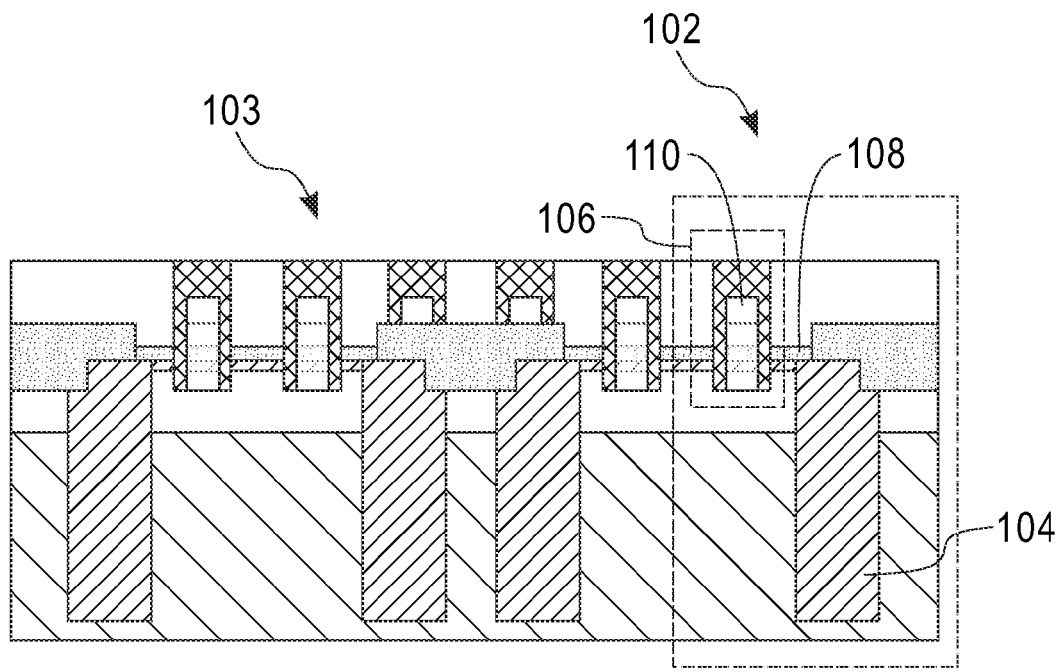
FIG. 1A shows an example embodiment of a memory cell that is part of a memory array contemplated by the present invention.
Figure 1B:
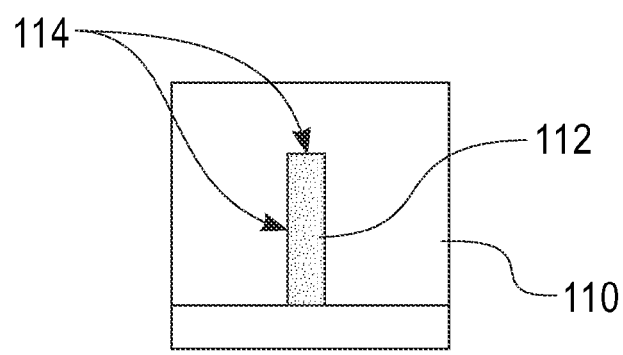
FIG. 1B shows an example transistor gate assembly and channel for accessing a memory cell.

FIGS. 1A-B show an example embodiment of a memory cell 102 that is part of a memory array 103. The memory array 103 may include a plurality of memory cells 102 and a processor. In one embodiment, the memory cells 102 are DRAM memory cells. The processor and the plurality of memory cells 102 may be both formed in the same monolithic silicon substrate. It is noted even though the follow description refers to a single memory cell, it is understood that the memory cell may be part of a memory array 103 of similar or identical memory cells.

In one embodiment of the invention, the memory cell includes a trench capacitor 104, a non-planar transistor 106, and a self-aligned silicide interconnect 108 electrically coupling the trench capacitor 104 to the non-planar transistor 106. The non-planar transistor 106 may include a transistor gate assembly 110 and a transistor channel 112. The transistor gate assembly 110 may have multiple gate surfaces 114 coupled to the transistor channel 112. In one embodiment, the non-planar transistor 106 is a finFET device.

Figure 2:
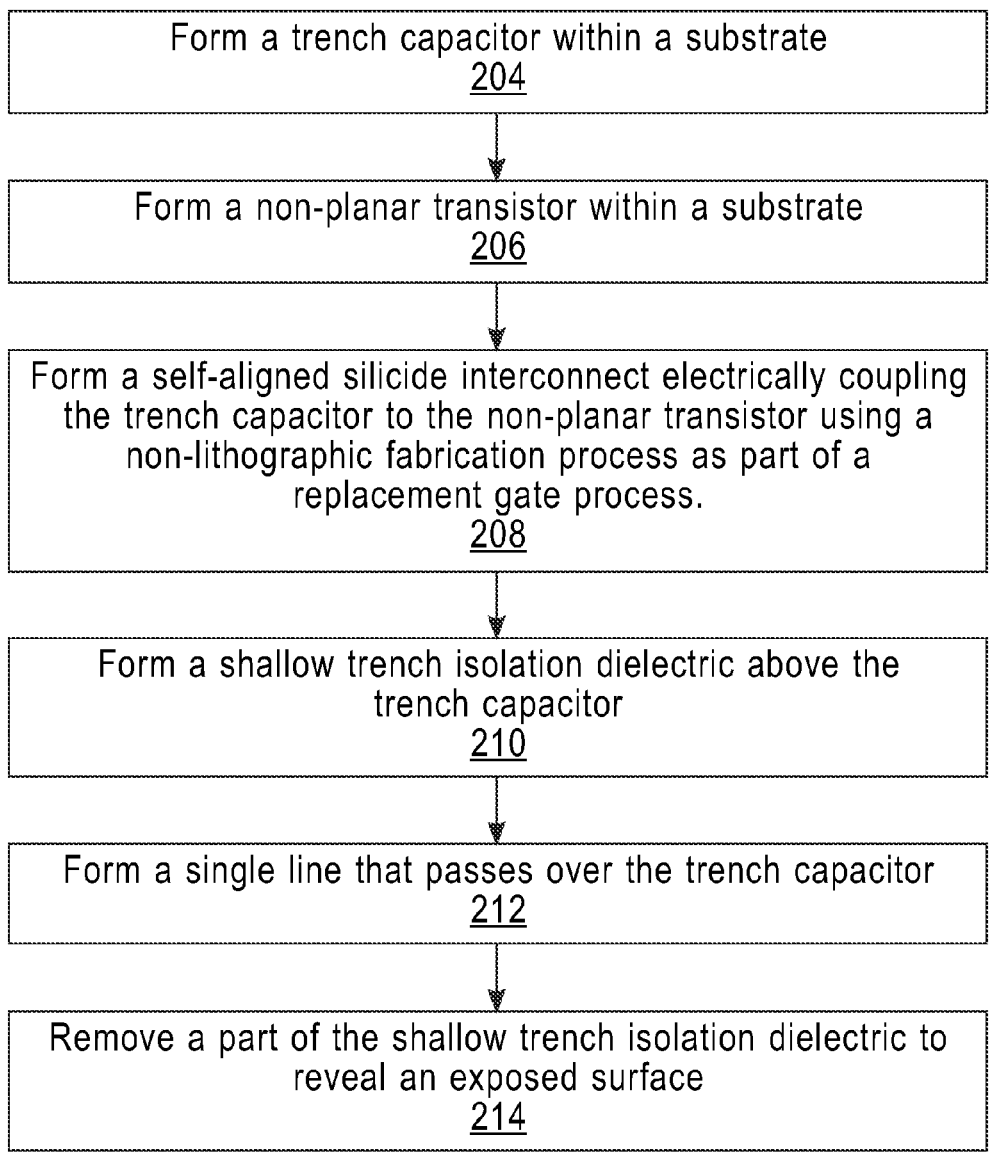
FIG. 2 shows an example embodiment of a method for fabricating a memory cell contemplated by the present invention.

FIG. 2 shows an example embodiment of a method 202 for fabricating semiconductor structures in accordance with the present invention. In one embodiment, method 202 includes a capacitor forming step 204 of forming a trench capacitor within a substrate, a transistor forming step 206 of forming a non-planar transistor within the substrate, and a silicide forming step 208 of forming a self-aligned silicide interconnect electrically coupling the trench capacitor to the non-planar transistor. Method 202 may also include an STI forming step 210 of forming a shallow trench isolation dielectric above the trench capacitor and a signal line forming step 212 of forming a signal line that passes over the trench capacitor. In the signal line forming step 212, the signal line may be separated from the trench capacitor by the shallow trench isolation dielectric formed in STI forming step 210. Method 202 may further include a removing step 214 of removing a part of the shallow trench isolation dielectric to reveal an exposed surface of the trench capacitor. In one embodiment, the self-aligned silicide interconnect is formed, at least in part, upon the exposed surface of the trench capacitor. Method 202 and all of its steps are explained in detail through FIGS. 3-20 and their accompanying description.

Figure 3A:
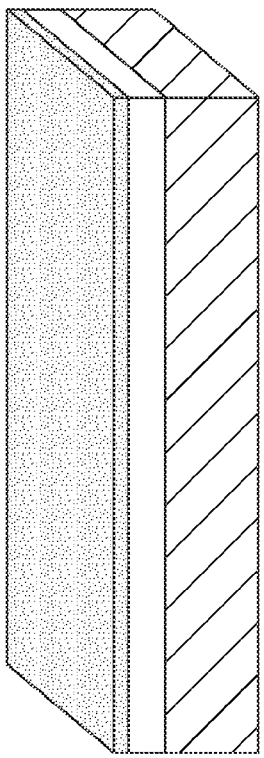
FIG. 3A shows a plan view of a silicon on insulator layer above an insulation layer on a substrate in accordance with an embodiment of the present invention.
Figure 3B:
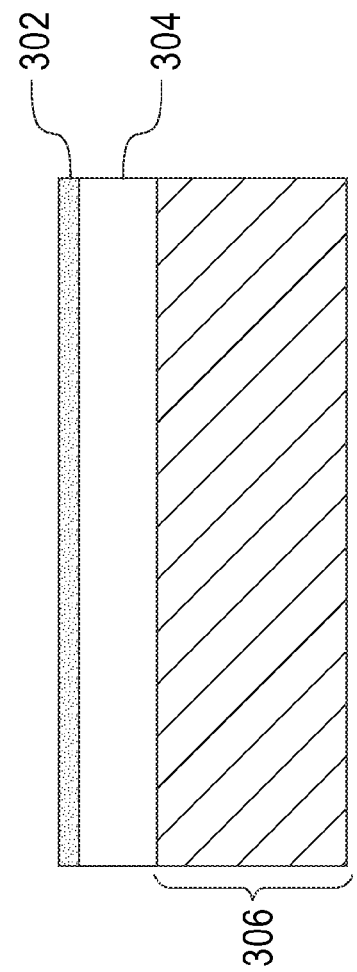
FIG. 3B shows a cross-sectional view of FIG. 3A.
Figure 3C:
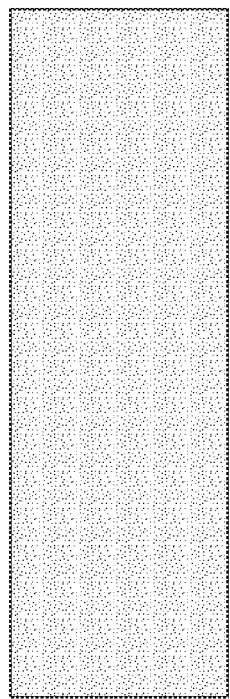
FIG. 3C shows an isometric cross-sectional view of FIG. 3A.

FIGS. 3A-C show a silicon on insulator ("SOI") layer 302 above an insulation layer 304 on a substrate 306. The SOI layer 302 may be formed by an SOI thinning process contemplated by the present invention. Those having ordinary skill in the art will recognize a variety of conventional techniques to form a SOI layer 302. One example method for forming the SOI layer 302 is by oxidation of a silicon substrate followed by a wet etch using diluted hydrofluoric acid. In one embodiment, the target thickness of the SOI layer 302 is about 25 nm.

Figure 4A:
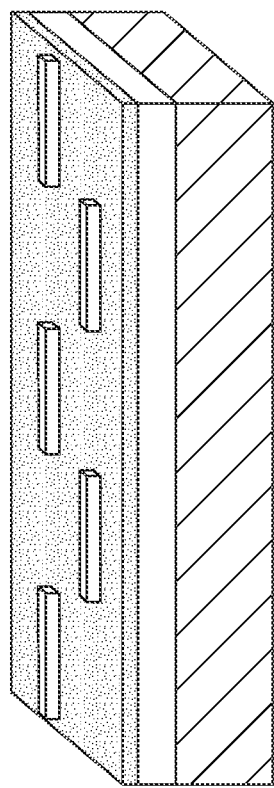
FIG. 4A shows the formation of a fin hard mask on the SOI layer in accordance with an embodiment of the present invention.
Figure 4C:
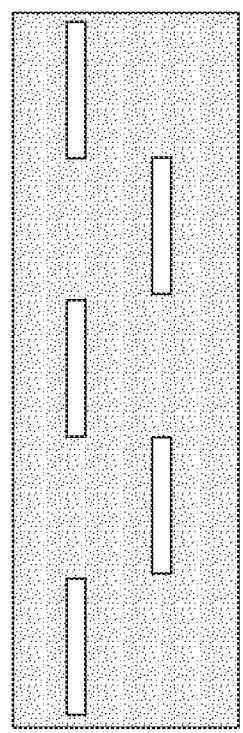
FIG. 4C shows an isometric cross-sectional view of FIG. 4A.
Figure 4B:
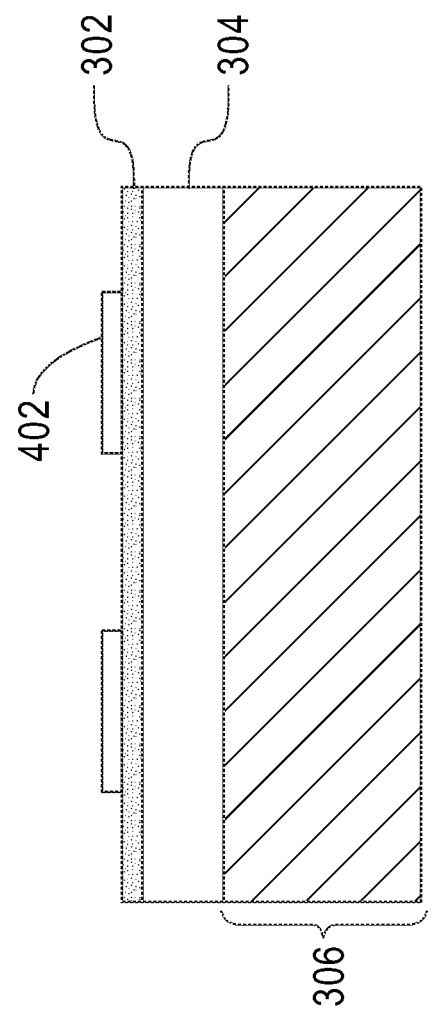
FIG. 4B shows a cross-sectional view of FIG. 4A.

FIGS. 4A-C show the formation of a fin hard mask 402 on the SOI layer 302. In one embodiment the fin hard mask 402 is formed by depositing a layer of silicon dioxide, silicon nitride, hafnium oxide, aluminum oxide or other suitable material onto the SOI layer 302. In another embodiment, the fin hard mask 402 is formed by leaving the final thinning oxide in place. Those of ordinary skill in the art will recognize a variety of lithography and etching techniques, such as reactive ion etching, to define fin hard mask patterns.

Figure 5A:
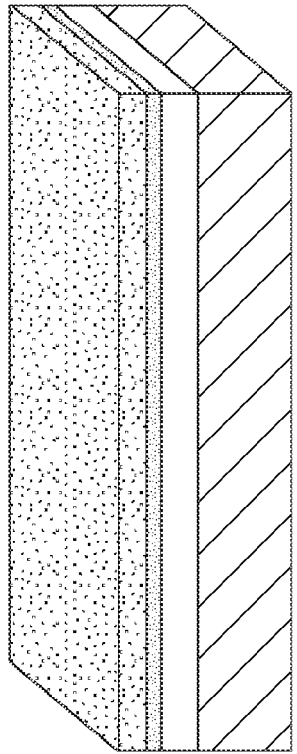
FIG. 5A shows the formation of a pad layer onto the fin hard mask in accordance with an embodiment of the present invention.
Figure 5B:
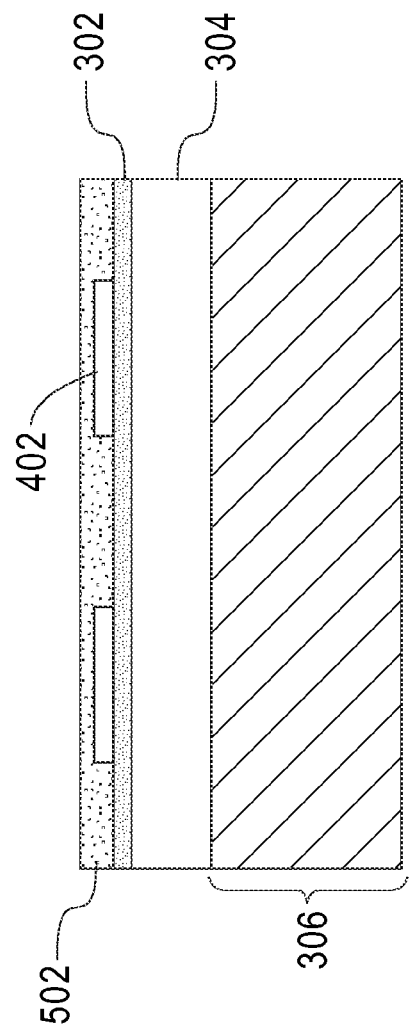
FIG. 5B shows a cross-sectional view of FIG. 5A.
Figure 5C:
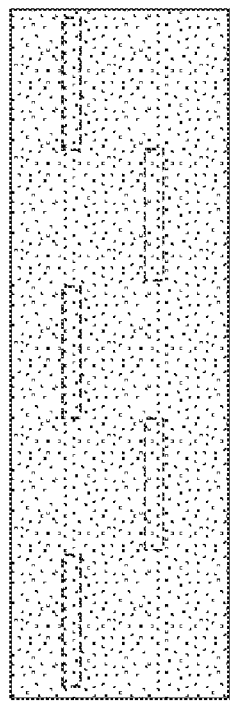
FIG. 5C shows an isometric cross-sectional view of FIG. 5A.

FIGS. 5A-C show the formation of a pad layer 502 onto the fin hard mask 402. In one embodiment the pad layer 502 is formed by depositing a layer of silicon nitride. The pad layer 502 may be planarized by a chemical mechanical polish. The pad layer 502 may be formed to protect the SOI layer 302 during the formation of a shallow trench isolation oxide described below. The pad layer 502 may be formed with a thickness so that about 40 nm remains after the formation of the shallow trench isolation oxide.

FIGS. 6A-C show the formation of a trench capacitor 104 and STI layer 602. FIGS. 6A-C also shows an example of the capacitor forming step 204 and STI forming step 210 from method 202 described above. In one embodiment, the trench capacitor may be a deep trench capacitor formed using processing standard to eDRAM. A shallow trench isolation dielectric may be formed above the trench capacitor 104 forming an STI layer 602 of silicon dioxide or other suitable material having a top coplanar with the pad layer 502. The trench capacitor 104 may include n+ polysilicon or other suitable material known to those of ordinary skill in the art. In one embodiment, the STI layer 602 and pad layer 502 thickness is 60 nm and the hard mask layer is 20 nm. The trench capacitor 104 may be formed so that the top of the trench capacitor 104 is coplanar with the top of the SOI layer 302.

FIGS. 7A-C show the formation of a resist layer 702 above the pad layer 502 and STI layer 602. In one embodiment, active region lithography is performed by forming the resist layer 702 directly above both the fin hard mask 402 and a portion of the STI layer 602.

Figure 8A:
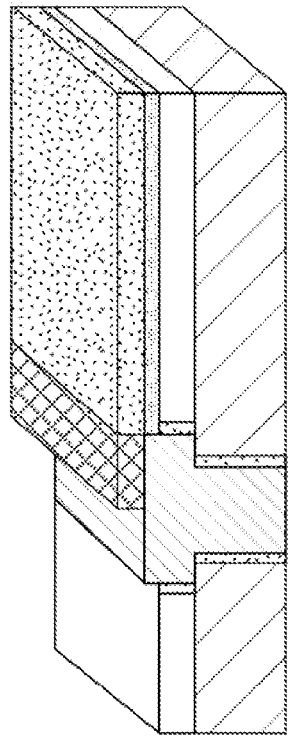
FIG. 8 shows the partial removal of several layers to form an isolation trench in accordance with an embodiment of the present invention.
FIG. 8B shows a cross-sectional view of FIG. 8A.
FIG. 8C shows an isometric cross-sectional view of FIG. 8A.
Figure 8C:
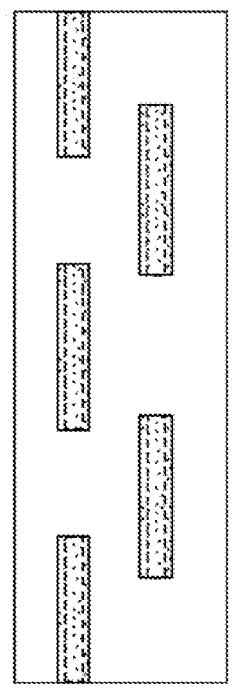
Figure 8B:
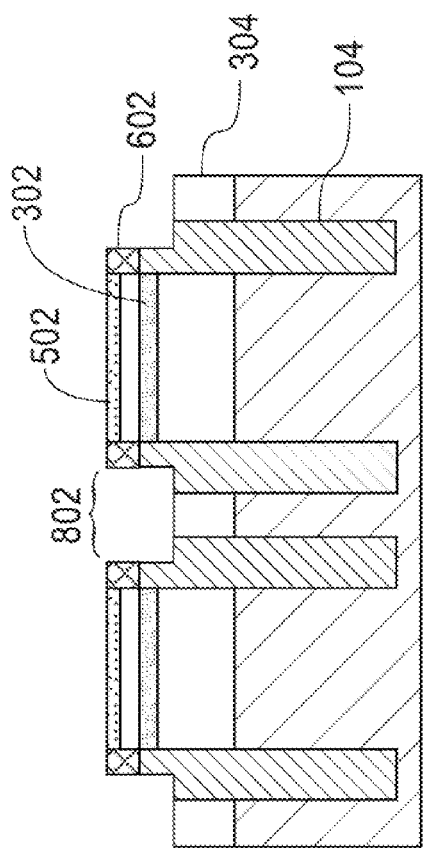

FIGS. 8A-C show the partial removal of several layers to form an isolation trench 802. In one embodiment, a reactive ion etch is performed, removing the resist layer 502 and portions of other layers not protected by the resist layer. Unprotected portions of the resist layer 502, STI layer 602, deep trench capacitor 104, and SOI layer 302 may be removed down to the insulation layer 304, leaving an isolation trench 802.

Figure 9C:
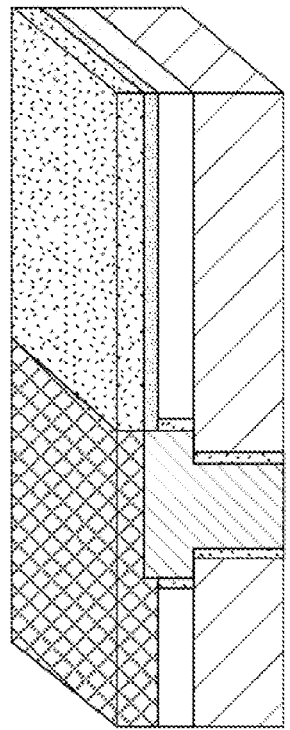
FIG. 9C shows an isometric cross-sectional view of FIG. 9A.
Figure 9A:
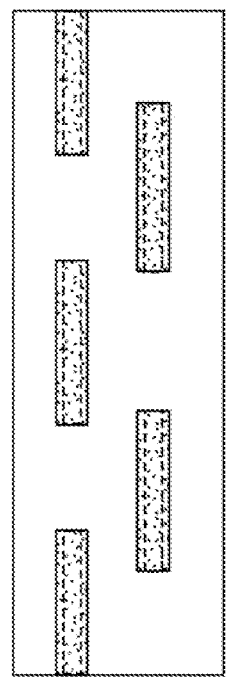
FIG. 9A shows the further formation of the STI layer in the isolation trench in accordance with an embodiment of the present invention.
Figure 9B:
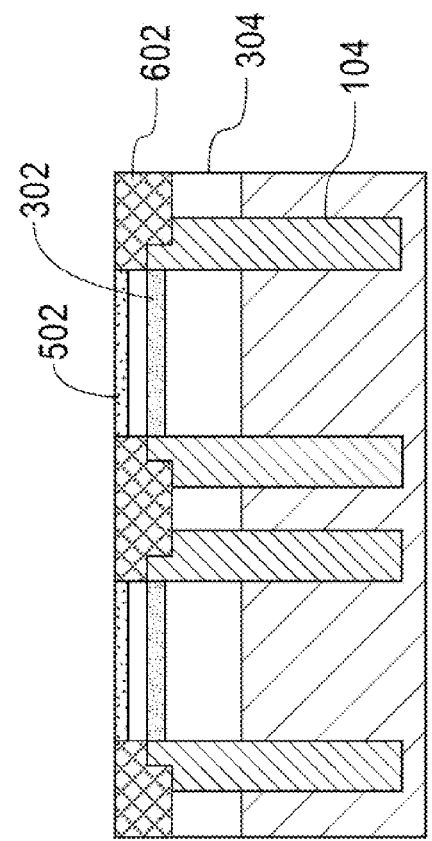
FIG. 9B shows a cross-sectional view of FIG. 9A.

FIGS. 9A-C show the further formation of the STI layer 602 in the isolation trench. The STI layer 602 may consist of an oxide. Those having ordinary skill in the art will recognize a variety of materials appropriate for shallow trench isolation. In one embodiment, chemical mechanical polishing is also used to form the STI layer 602 coplanar with the pad layer 502, reducing the thickness of both layers to 40 nm.

Figure 10A:
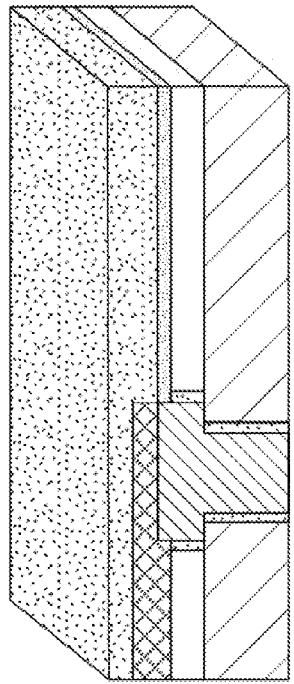
FIG. 10A shows the formation of a dummy gate layer above the pad layer and STI layer in accordance with an embodiment of the present invention.
Figure 10C:
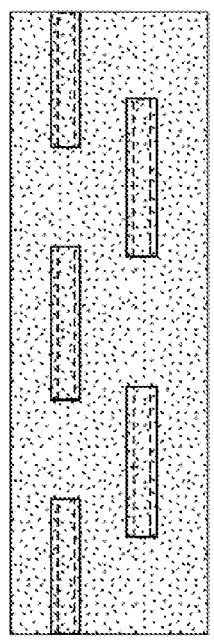
FIG. 10C shows an isometric cross-sectional view of FIG. 10A.
Figure 10B:
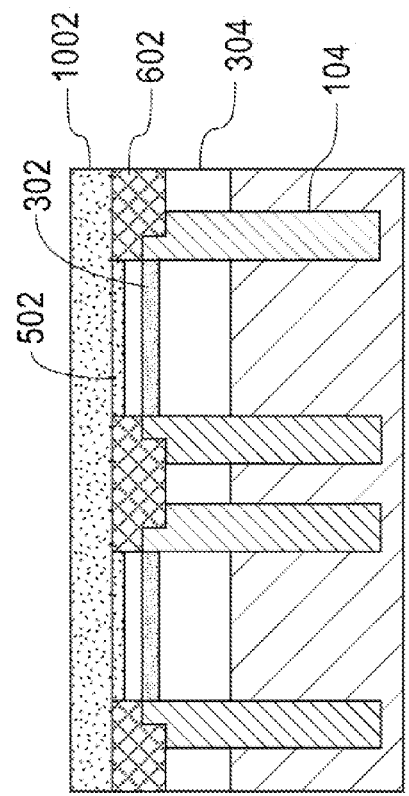
FIG. 10B shows a cross-sectional view of FIG. 10A.

FIGS. 10A-C show the formation of a sacrificial or "dummy" gate layer 1002 above the pad layer 502 and STI layer 602. In one embodiment the dummy gate layer 1002 may include silicon nitride. In another embodiment, the dummy gate layer may include polysilicon. A suitable thickness of the dummy gate layer 1002 may be 40 nm, but the thickness may be chosen based on the desired height of a later formed gate electrode. It is noted that the original thickness may be altered through subsequent steps in the process flow, resulting in a final desired thickness.

Figure 11C:
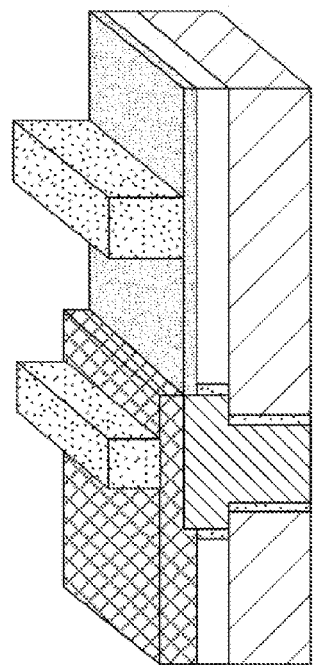
FIG. 11C shows an isometric cross-sectional view of FIG. 11A.
Figure 11A:
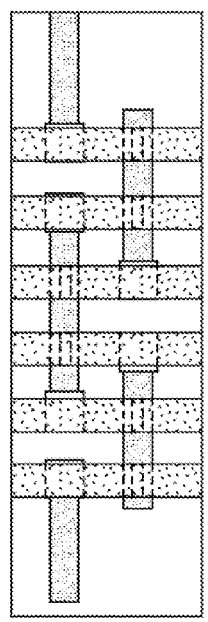
FIG. 11A shows the formation of a dummy gate by patterning of the dummy gate layer in accordance with an embodiment of the present invention.
Figure 11B:
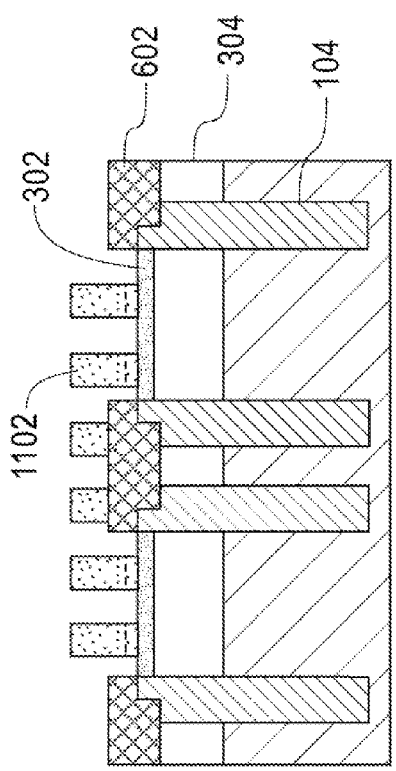
FIG. 11B shows a cross-sectional view of FIG. 11A.

FIGS. 11A-C show the formation of a dummy gate 1102 by patterning of the dummy gate layer 1002. In one embodiment, lithography and reactive ion etching are used to pattern the dummy gate 1102. The reactive ion etching may be selective to material in the STI layer 602, leaving the STI layer 602 intact.

Figure 12A:
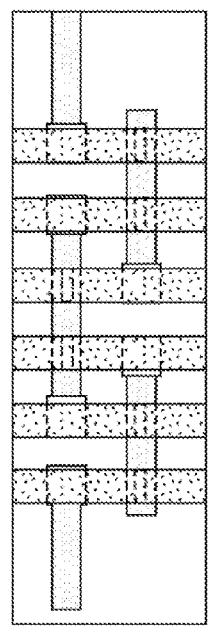
FIG. 12A shows the formation of a self-aligned silicide interconnect in accordance with an embodiment of the present invention.
Figure 12B:
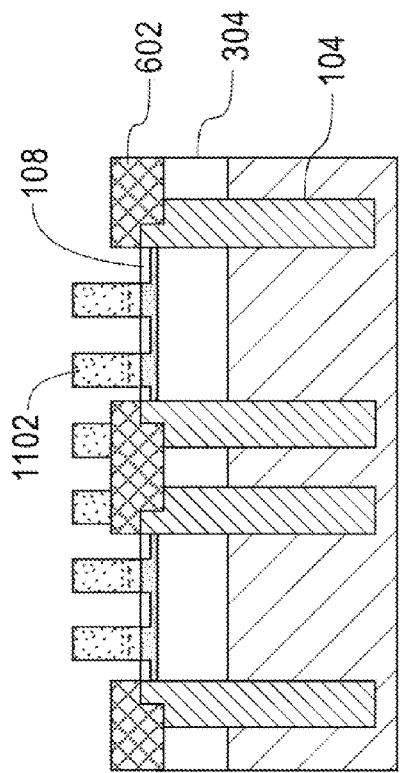
FIG. 12B shows a cross-sectional view of FIG. 12A.
Figure 12C:
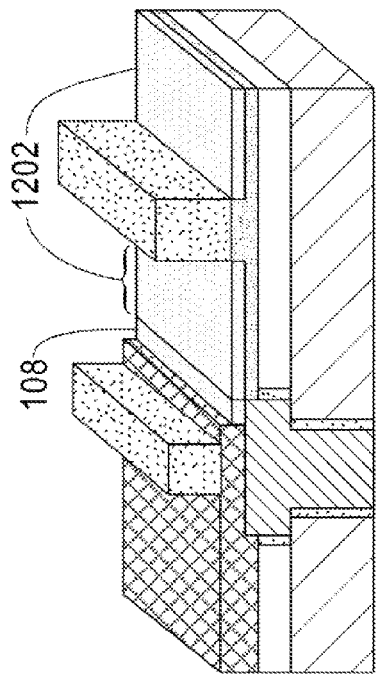
FIG. 12C shows an isometric cross-sectional view of FIG. 12A.

FIGS. 12A-C show the formation of a self-aligned silicide interconnect 108. FIGS. 12A-C further show an example of the removing step 214 and the silicide forming step 208 of method 202 described above. In one embodiment, the self-aligned silicide interconnect 108 is formed using a non-lithographic fabrication process. To form the silicide interconnect 108, implants may be performed by ion implantation followed by dopant activation through an annealing process. The ion implantation may include arsenic or phosphorus as sources for ions for example to form an N-fet device. In one embodiment, the silicide interconnect 108 could be Co2O4Si, or any silicide which can service the temperatures needed for gate last integration schemes in logic and may assume a dual silicide process.

In one embodiment, the silicide interconnect 108 may be formed after a silicide preclean. During the preclean, a part of the shallow trench isolation dielectric layer 602 may be removed to reveal an exposed surface of the trench capacitor 104. The self-aligned silicide interconnect 108 may be formed, at least in part, upon the exposed surface of the trench capacitor 104 revealed by a partially removed section of the shallow trench isolation dielectric layer 602.

As illustrated below, the self-aligned silicide interconnect 108 may be formed as part of a replacement gate process flow in which a transistor gate stack is formed after formation and removal of a dummy gate at the non-planar transistor. In one embodiment, a portion of the silicide interconnect may form a raised source/drain 1202.

Figure 13A:
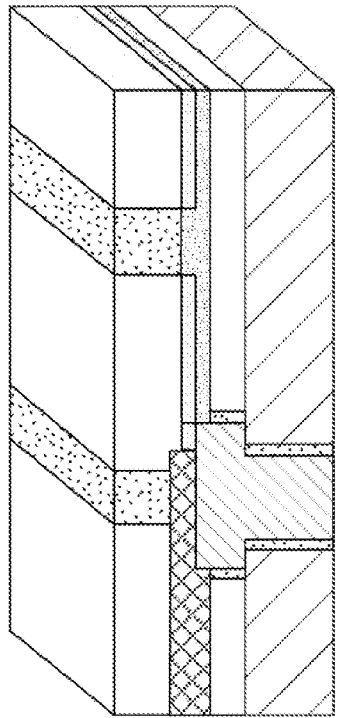
FIG. 13A shows the deposition of a dielectric layer in accordance with an embodiment of the present invention.
Figure 13C:
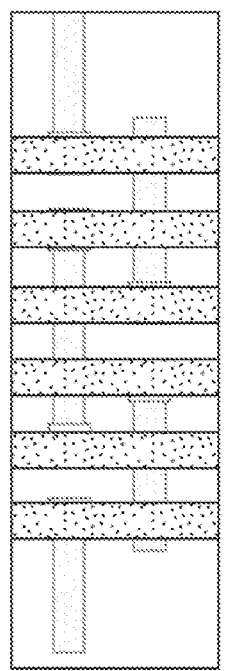
FIG. 13C shows an isometric cross-sectional view of FIG. 13A.
Figure 13B:
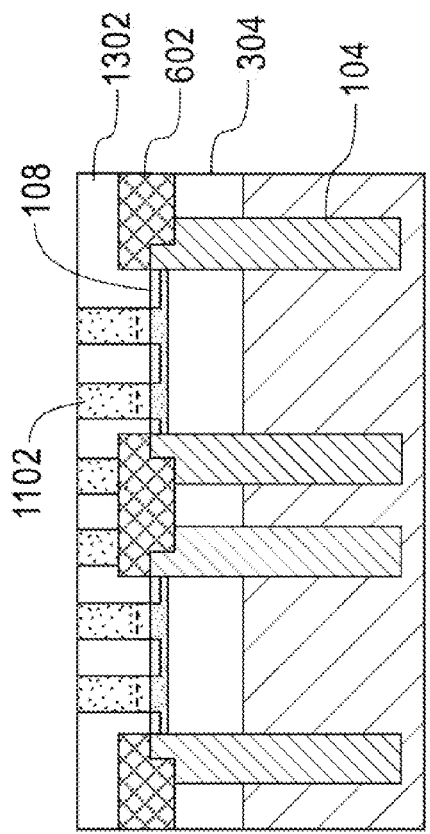
FIG. 13B shows a cross-sectional view of FIG. 13A.

FIGS. 13A-C show the deposition of a dielectric layer 1302. The dielectric layer 1302 may consist of silicon dioxide or a silicon dioxide based film. Suitable deposition processes may include spin-on dielectric materials, PECVD, CVD and ALD or some combination of these techniques. In one embodiment, the dielectric layer 1302 is polished back to reveal the top of the dummy gate 1102. At this stage of the process example thicknesses are as follows: 80 nm for the fin hard mask, 80 nm for the dummy gate above the fin hard mask, 40 nm for the dummy gate above the STI layer, and an STI layer that varies from 40 nm on portions below the dummy gate to 30 nm on the edge next to the silicide interconnect.

Figure 14A:
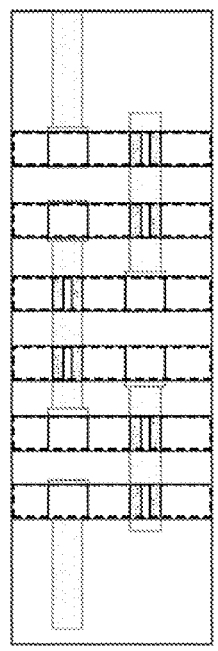
FIG. 14A shows the removal of the dummy gate to form a gate trench in accordance with an embodiment of the present invention.
Figure 14C:
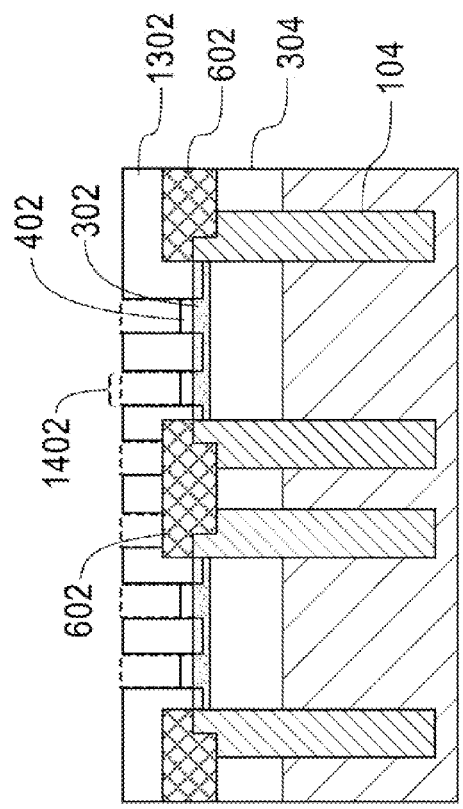
FIG. 14C shows an isometric cross-sectional view of FIG. 14A.
Figure 14B:
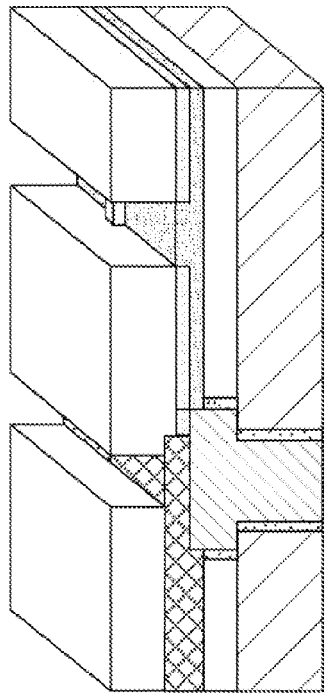
FIG. 14B shows a cross-sectional view of FIG. 14A.
Figure 15A:
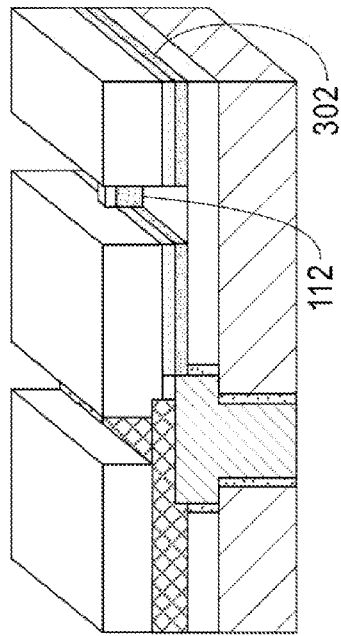
FIG. 15A show the etching of a transistor channel in the SOI layer in accordance with an embodiment of the present invention.
Figure 15C:
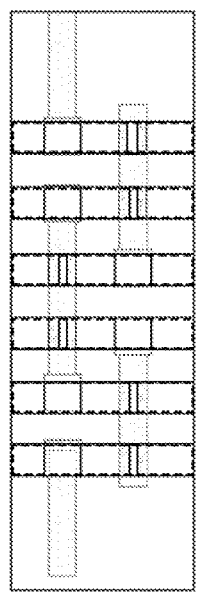
FIG. 15C shows an isometric cross-sectional view of FIG. 15A.
Figure 15B:
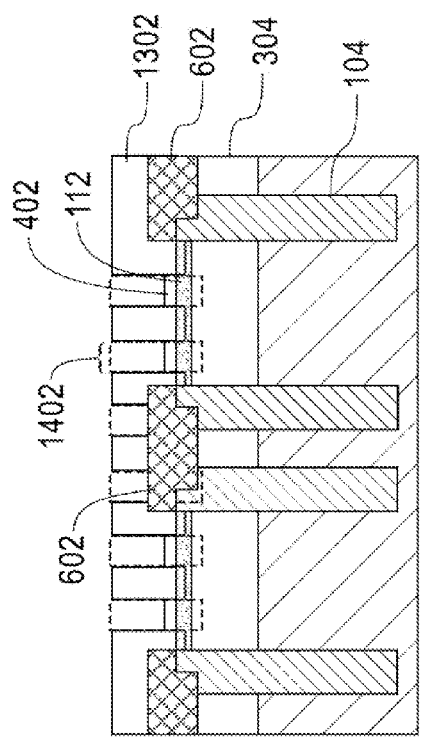
FIG. 15B shows a cross-sectional view of FIG. 15A.

FIGS. 14A-C show the removal of the dummy gate 1102 to form a gate trench 1402. The dummy gate may be removed using wet or dry chemical etching. The process may be selective to the materials of the dielectric layer, STI dielectric layer and the SOI layer. In one embodiment, the removal of the dummy gate reveals the fin hard mask 402, a portion of the SOI layer, and a portion of the STI layer 602. The gate trench may be 80 nm deep the above the fin hard mask and 40 nm deep above the STI layer FIGS. 15A-C show the etching of a transistor channel 112 in the SOI layer 302. The transistor channel 112 may be a fin for a finFET device. In one embodiment, etching is accomplished using an anisotropic reactive ion etch that is selective to the material of the fin hard mask 402. In another embodiment, the fin reactive ion etch may include an intentional BOX recess, eliminating some of the fin hard mask 402. In one embodiment, the new thickness of the fin hard mask is 15 nm. The thickness of the STI layer may also be recessed to 35 nm.

Figure 16A:
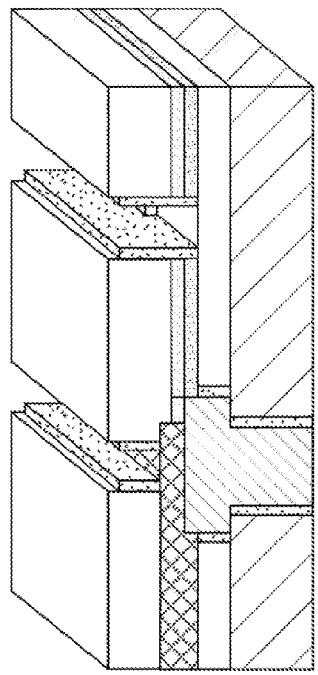
FIG. 16A show formation of a sidewall spacer in accordance with an embodiment of the present invention.
Figure 16C:
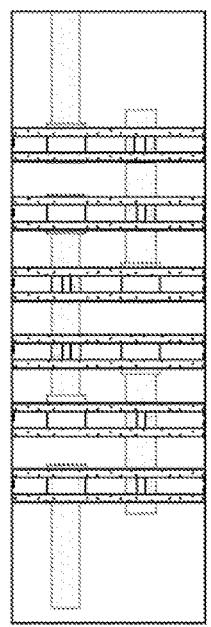
FIG. 16C shows an isometric cross-sectional view of FIG. 16A.
Figure 16B:
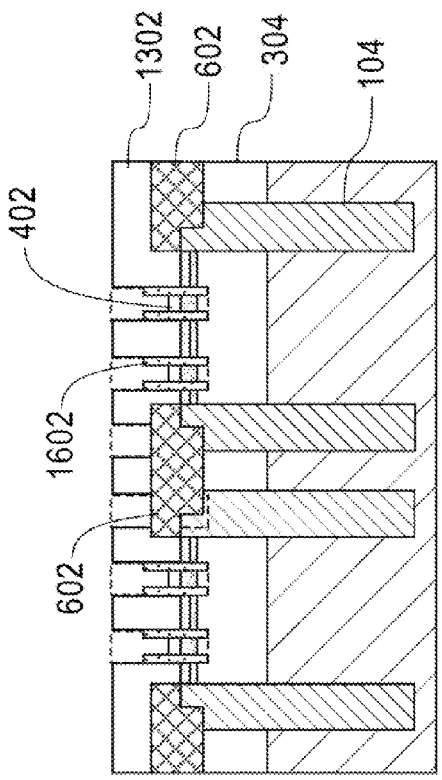
FIG. 16B shows a cross-sectional view of FIG. 16A.

FIGS. 16A-C show formation of an optional sidewall spacer 1602 by deposition of a thin conformal layer on the walls the dielectric layer 1302 inside the gate trench followed by a reactive ion etch. The sidewall spacer 1602 may be formed from a suitable dielectric, such as silicon nitride, boron nitride, or silicon dioxide. Suitable deposition processes may include LPCVD, RTCVD, and ALD. In one embodiment, the etching process may be highly anisotropic and be carried out with a sufficient over-etch to remove the sidewall spacer material from the bottom of the gate trench 1402. At this stage of the process, example thicknesses are as follows: 75 nm for the gate trench above the transistor channel, 40 nm for the gate trench above the STI layer, 65 nm for portions the dielectric layer above the silicide interconnect, 30 nm for portions of the dielectric layer above the STI layer, and 25 nm for portions of the STI layer directly below the dielectric layer.

Figure 17A:
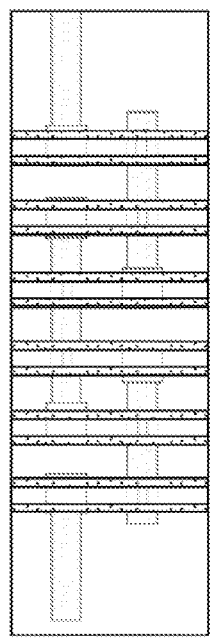
FIG. 17A show the formation of a transistor gate assembly in accordance with an embodiment of the present invention.
Figure 17C:
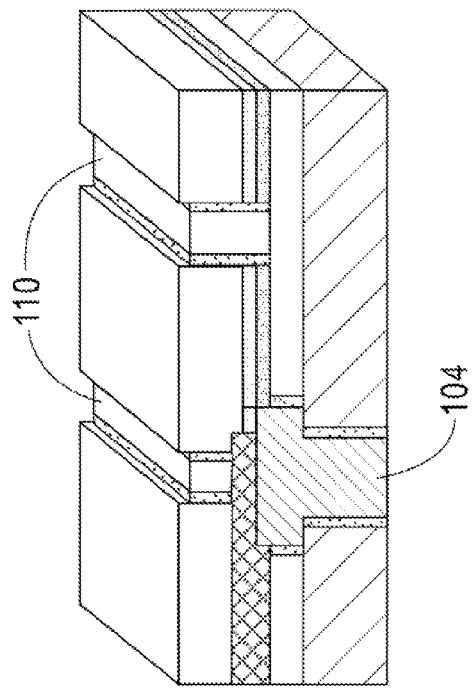
FIG. 17C shows an isometric cross-sectional view of FIG. 17A.
Figure 17B:
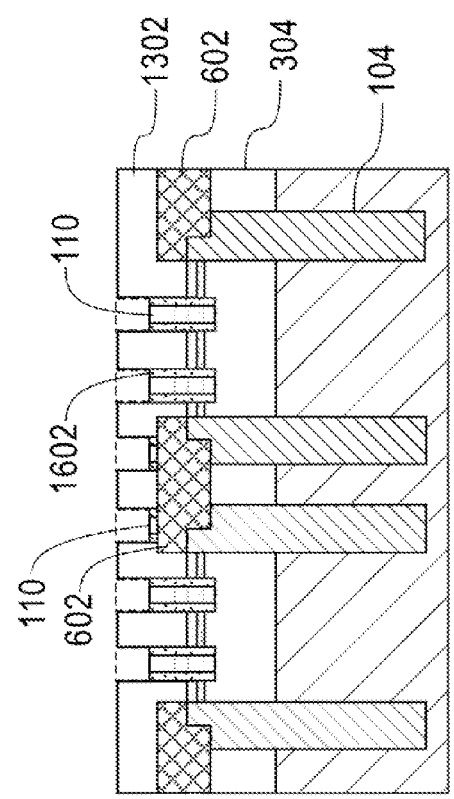
FIG. 17B shows a cross-sectional view of FIG. 17A.

FIGS. 17A-C show the formation of a transistor gate assembly 110. FIGS. 17A-C also show an example of the signal line forming step 112 from method 202 described above. In one embodiment, the transistor gate assembly 110 for one memory cell may also be a signal line that passes over the trench capacitor of another cell. The signal line may be separated from the trench capacitor 104 by the shallow trench isolation dielectric layer 602. Before deposition of the transistor gate assembly, a wet or dry preclean may be used to remove damage to the surface of the transistor channel. Following the preclean, the transistor gate assembly materials may be deposited into the gate trench 1402. In one embodiment, the transistor gate assembly 110 includes a gate dielectric and a gate electrode. The gate dielectric may include $SiO_2$, $SiO_xN_y$, $HfO_2$, $HfO_xN_y$, $HfO_xSiN_y$, $Al_2O_3$, $ZrO_2$. The gate electrode may include one or more workfunction setting materials and a capping layer. Workfunction setting materials may include TiN, TaN, $La_2O_3$, AlO, TaAlN, Al. The capping layer may include Ti, Al, TiAl alloys, W or Ru. Following deposition, extra material may be removed that is present in the field. Appropriate techniques for removal may include dry etching or chemical mechanical polishing.

Figure 18A:
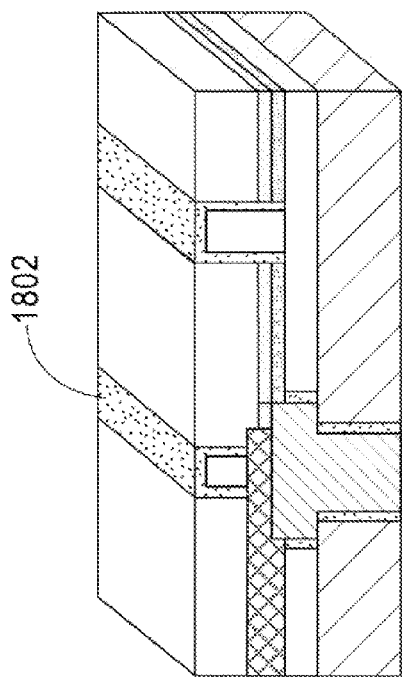
FIG. 18A show the formation of a transistor gate assembly passivation layer in accordance with an embodiment of the present invention.
Figure 18C:
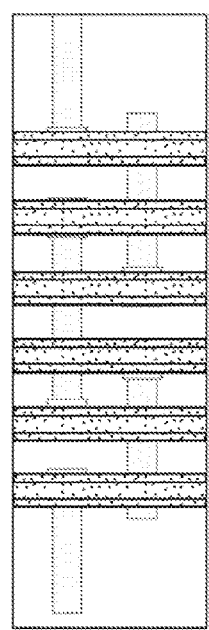
FIG. 18C shows an isometric cross-sectional view of FIG. 18A.
Figure 18B:
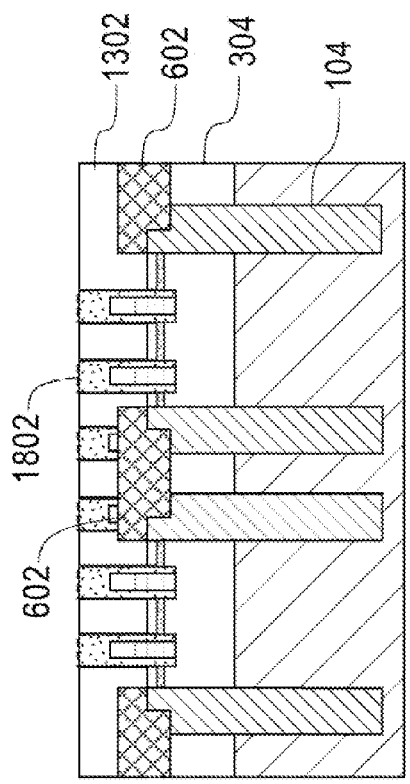
FIG. 18B shows a cross-sectional view of FIG. 18A.

FIGS. 18A-C show the formation of a transistor gate assembly passivation layer 1802. In one embodiment, the transistor gate assembly passivation layer 1802 is optional. The transistor gate assembly passivation layer 1802 may be deposited above the transistor gate assembly 110. Suitable dielectric materials for the transistor gate assembly passivation layer 1802 may include SiN, Al2O3, or HfO2. Excess dielectric material deposited as part of the gate stack passivation layer 1802 may be removed from the field using either chemical mechanical polishing or a reactive ion etch process. In one embodiment, at this stage of the formation process, the STI layer is 30 nm, the transistor gate assembly is 60 nm for portions above the transistor channel and 30 nm for portions above the STI layer of another memory cell, and the dielectric layer is 25 nm on portions above the STI layer.

Figure 19A:
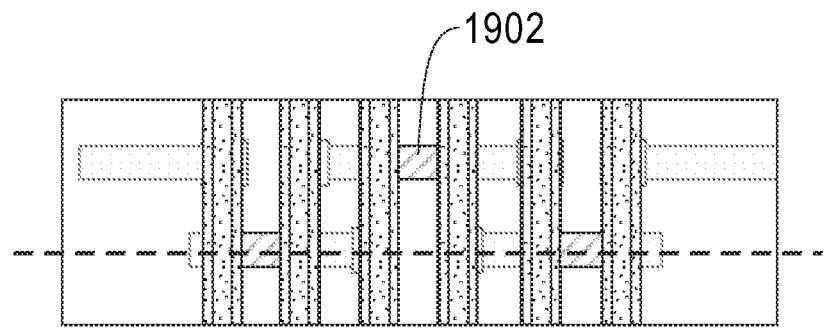
FIG. 19A shows the formation of a gate contact in accordance with an embodiment of the present invention.
Figure 19B:
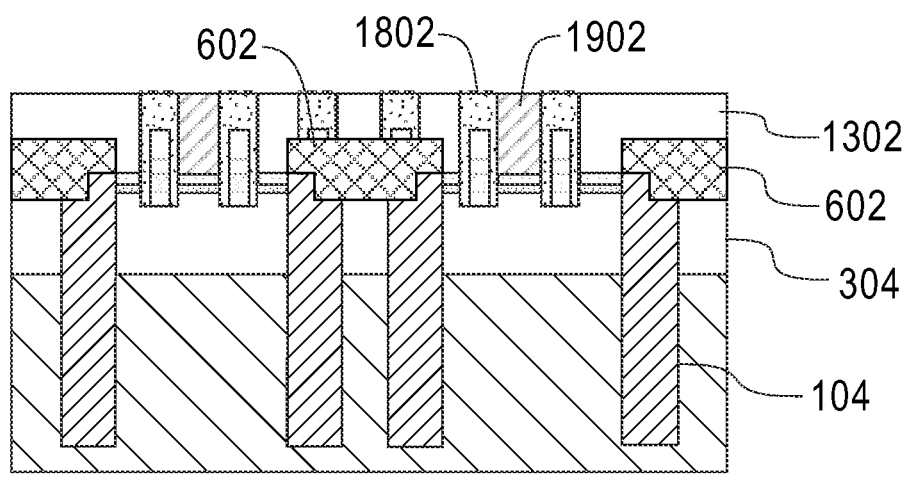
FIG. 19B shows a cross-sectional view of FIG. 19A.

FIGS. 19A-B show the formation of a gate contact 1902. The gate contact 1902 may be formed by lithography and reactive ion etching followed by metal deposition and field removal techniques. In an embodiment with a gate assembly passivation layer, a borderless contact reactive ion etch may be used where oxide is etched selectively to Si, SiN and Silicide.

Figures 20A, 20B:
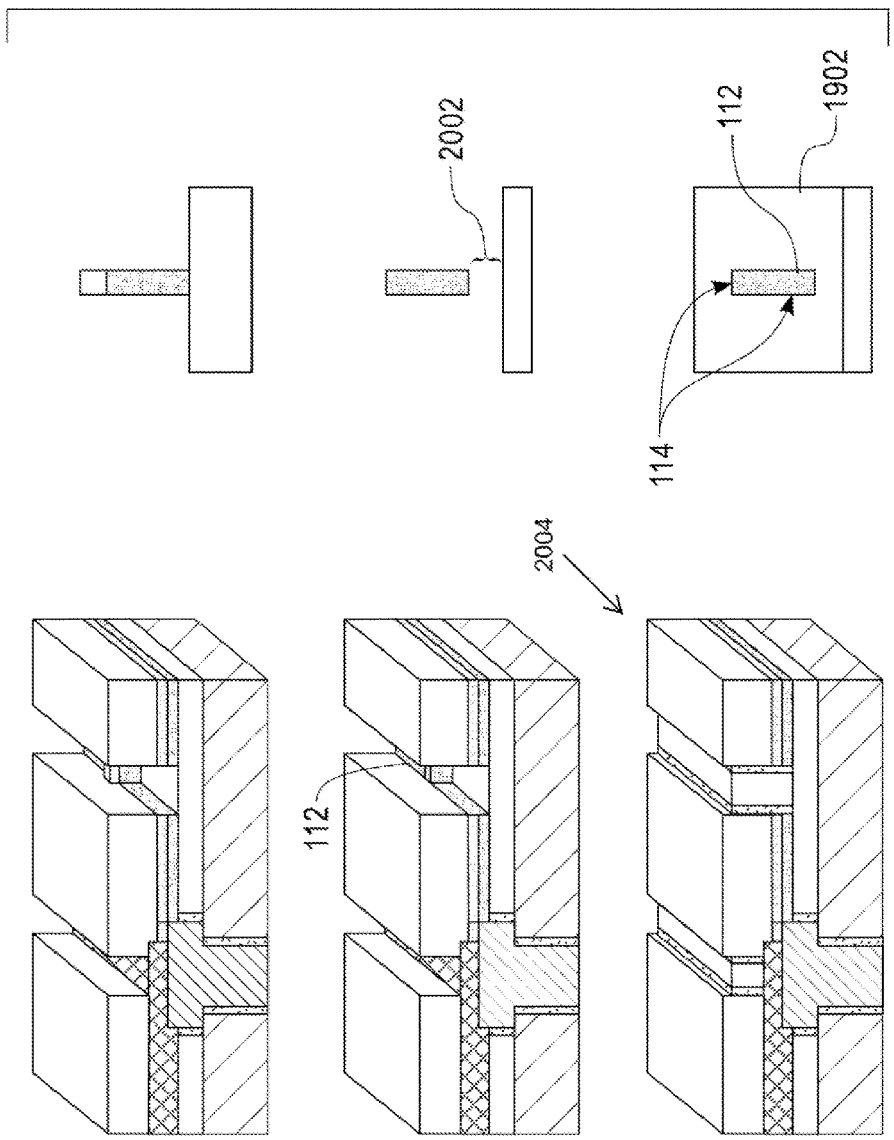
FIG. 20A shows the formation of an example embodiment of the memory cell that includes a nano-wire multigate device in accordance with an embodiment of the present invention.
FIG. 20B shows a cross-sectional view of FIG. 20A.

FIGS. 20A-B show the formation of an example embodiment of the memory cell 102 that includes a nano-wire multigate device 2004. In these two figures, successive steps are shown in time order from top to bottom. FIG. 20A shows three dimensional views of a memory cell as a nano-wire is formed. FIG. 20B shows cross-sectional views of the memory cell along the width of the transistor channel as the nano-wire is formed. In one embodiment, the nano-wire is formed so that the non-planar transistor 106 is a nano-wire multigate device. The nano-wire multigate device 2004 may be formed so that the transistor gate assembly 110 surrounds the transistor channel 112 on surfaces 114 of the transistor channel parallel to the length of the transistor channel. In one embodiment of the invention, a nano-wire or gate all-around (GAA) multigate device can be formed by undercutting the transistor channel 112 during transistor gate assembly preclean, creating a region 2002 underneath the transistor channel where the transistor gate assembly 110 can be formed. As described above, a transistor gate assembly, transistor gate assembly passivation layer, and contact may subsequently be formed to finish the formation of the nano-wire or gate all around multigate device 2004.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method for fabricating a memory cell transistor, the method comprising:
    forming a trench capacitor within a substrate;
    forming a non-planar transistor including a transistor gate assembly and a transistor channel, the transistor gate assembly having multiple gate surfaces coupled to the transistor channel, the transistor channel of the non-planar transistor is positioned, at least partially, on a different plane than source/drain regions of the non-planar transistor;
    forming a self-aligned silicide interconnect electrically coupling the trench capacitor to the non-planar transistor by ion implantation followed by dopant activation through an annealing process, a portion of the self-aligned silicide interconnect forming one of the source/drain regions;
    depositing a dielectric layer over and in contact with the self-aligned silicide interconnect electrically coupling the trench capacitor to the non-planar transistor; and
    forming a transistor passivation layer above and in contact with the transistor gate assembly, the transistor passivation layer entirely filling a trench defined by the dielectric layer.

2. The method of claim 1, further comprising:
    forming a shallow trench isolation dielectric above the trench capacitor; and
    forming a signal line that passes over the trench capacitor, the signal line being separated from the trench capacitor by the shallow trench isolation dielectric.

3. The method of claim 2, further comprising:
    removing a part of the shallow trench isolation dielectric to reveal a surface of the trench capacitor;
    wherein the self-aligned silicide interconnect is formed, at least in part, upon the surface of the trench capacitor.

4. The method of claim 1, wherein the non-planar transistor is a fully depleted finFET device.

5. The method of claim 1, wherein the non-planar transistor is a nano-wire multigate device, the transistor gate assembly surrounding the transistor channel on surfaces of the transistor channel parallel to the length of the transistor channel.

6. The method of claim 1, wherein the self-aligned silicide interconnect is formed as part of a replacement gate process flow in which the transistor gate is formed after formation and removal of a dummy gate at the non-planar transistor.

7. The method of claim 1, wherein the self-aligned silicide interconnect is formed using a non-lithographic fabrication process.

* * * * *